United States Patent [19]
Dell et al.

[11] Patent Number: 5,896,346
[45] Date of Patent: Apr. 20, 1999

[54] HIGH SPEED AND LOW COST SDRAM MEMORY SUBSYSTEM

[75] Inventors: Timothy J. Dell, Colchester, Vt.; George C. Feng, Wappingers Falls, N.Y.; Mark W. Kellogg, Essex Junction, Vt.

[73] Assignee: International Business Machines Corporation, Armonk, N.Y.

[21] Appl. No.: 08/918,097

[22] Filed: Aug. 21, 1997

[51] Int. Cl.$^6$ ................................................. G11C 8/00
[52] U.S. Cl. ................................................. 365/233; 365/189
[58] Field of Search ........................... 365/201, 230.01, 365/52, 233, 189

[56] References Cited

U.S. PATENT DOCUMENTS

| | | |
|---|---|---|
| 4,813,014 | 3/1989 | DeBell . |
| 4,958,322 | 9/1990 | Kosugi et al. . |
| 5,164,916 | 11/1992 | Wu et al. . |
| 5,272,664 | 12/1993 | Alexander et al. . |
| 5,278,801 | 1/1994 | Dresser et al. . |
| 5,341,486 | 8/1994 | Castle . |
| 5,357,624 | 10/1994 | Lavan . |
| 5,513,135 | 4/1996 | Dell et al. ................ 365/52 |
| 5,533,194 | 7/1996 | Albin et al. .............. 365/201 |
| 5,721,860 | 2/1998 | Stolt et al. ............ 365/230.01 |

*Primary Examiner*—David Nelms
*Assistant Examiner*—Thong Le
*Attorney, Agent, or Firm*—DeLio & Peterson, LLC; Peter W. Peterson; Howard J. Walter, Jr.

[57] ABSTRACT

A synchronous dynamic random access memory subsystem includes two banks of connectors for receiving single or dual in-line memory modules. A clock is located in close proximity to the connectors and produces clock pulses having a known rise time. Clock wiring is placed between the clock and the connectors, and module wiring carries the clock pulses from the connectors to the memory. The wiring has an impedance and length such that the round trip delay time of clock pulses between the clock and the memory is less than the rise time of the clock pulses. The clock is preferably located between the two banks of connectors to reduce wiring length to a minimum and minimize coupled noise.

19 Claims, 2 Drawing Sheets

HIGH SPEED AND LOW COST SDRAM MEMORY SUBSYSTEM

BACKGROUND OF THE INVENTION

1. Field of the Invention

This invention relates to high speed and low cost memory subsystems for synchronous dynamic random access memory (SDRAM). The invention is particularly directed to controlling the layout of high capacity SDRAM memory modules and the positioning of associated electronics in light of a known signal rise time to avoid problems related to transmission line effects.

2. Description of Related Art

Synchronous dynamic random access memory offers a significant increase in speed over conventional dynamic random access memory (DRAM). SDRAM memory often operates at speeds above 66 MHz and 100 MHz or faster SDRAM systems are expected to become widely used. This increase in speed, however, creates a new set of problems for memory subsystem design as transmission line effects become more important.

In any memory system, it is important to maintain the signal integrity of the address, control and clock signals, however, this is particularly difficult at the high speeds of SDRAM systems as transmission line effects begin to appear. To avoid transmission line reflections in SDRAM subsystems, a solution has been proposed requiring the use of series resistors, such as thin film buried resistors. This solution also requires resistive/capacitive termination, e.g. AC termination, at both ends of the wiring. This is a relatively complex and expensive solution to the problem. Furthermore, the resulting signals may still be poor to marginally acceptable at some points in the system.

Another approach to maintaining high quality signals in high speed SDRAM systems involves the use of specially designed buses and interfaces. However, this approach is also relatively complex and costly.

Yet another difficulty with high capacity SDRAM relates to the numerous address lines needed for the amount of memory to be accessed. For example, newer high capacity SDRAM is typically mounted in dual in-line memory modules (DIMMs) having 168 or 200 pins, although single in-line memory module (SIMM) implementations are also used. SDRAM also uses a few additional signals not needed for conventional DRAM, such as the clock signal. This adds to the number of connections that must be made in the memory subsystem.

The large number of required connections in modern SDRAM/DIMM systems requires space for the interconnecting wiring, which in prior memory subsystems has resulted in long distances between the SDRAM memory and components such as memory controllers, the clock and multiplexers. This causes problems with signal reflection due to the length of the wiring involved. The numerous connections and distances between the memory and the associated memory subsystem components of prior designs has resulted in long parallel wiring nets which creates many difficulties with cross coupling between the wiring, particularly when multiple banks of memory are used.

The problem of laying out the wiring for the large number of connections in an SDRAM system is doubled when a dual memory bank design is selected as compared to a single bank design. Some implementations of SDRAM systems have offered only a single bank of memory modules. A single bank design is simpler to design and produce, but offers less flexibility and performance than a dual bank design.

The present invention provides an SDRAM memory subsystem suitable for use with at least eight DIMMs of SDRAM high speed memory organized into two banks. The invention operates well at speeds up to at least 100 MHz and also allows complete compatibility with conventional DRAM DIMMs or SIMMs. Further, the present design is relatively inexpensive as compared to previously proposed solutions to the layout and transmission line problems. It may use the same DIMM connectors and motherboards as more conventional DRAM memory subsystem designs and does not require thin film buried series resistors on the DIMM for the data nets.

The layout and configuration of the wiring and support electronics in the memory subsystem of the present invention reduce the coupled noise between the large number of parallel data nets which has plagued prior implementations of dual bank designs.

Bearing in mind the problems and deficiencies of the prior art, it is therefore an object of the present invention to provide an SDRAM memory subsystem which is low cost and which does not require the use of series resistors.

Still another object of the present invention is to provide an SDRAM memory subsystem which does not suffer from poor signals due to transmission line effects.

It is another object of the present invention to provide an SDRAM memory subsystem design which offers a dual bank design with at least eight SDRAM DIMMs.

A further object of the invention is to reduce coupled noise in a multiple memory bank design.

It is yet another object of the present invention to provide a memory subsystem which may be used interchangeably with high speed SDRAM/DIMMs and more conventional DRAM memory.

Still other objects and advantages of the invention will in part be obvious and will in part be apparent from the specification.

SUMMARY OF THE INVENTION

The present invention comprises a synchronous dynamic random access memory subsystem which operates at high speed without the necessity for near or far end wiring termination or for embedded series resistors. The invention is based upon a particular layout which places critical electronic support components, such as the clock, near to the SDRAM memory. This allows the wiring to be quite short as needed to comply with a critical length parameter for the wiring when arranged according to the invention.

More specifically, the invention includes a circuit board and a plurality of connectors mounted thereto in close proximity to one another. This places the memory close together to minimize the distance signals must travel. The connectors are designed to receive corresponding SDRAM memory modules. Module wiring, i.e., wiring on the memory module, carries clock pulses from the corresponding connector to SDRAM memory chips mounted on the module. A clock producing clock pulses is mounted to the circuit board in close proximity to the connectors, and clock wiring is located on the circuit board between the clock and the connectors. The pulses produced by the clock have a known rise time which sets limits upon the layout and positioning of the clock wiring according to the invention. The clock wiring carries the clock pulses from the clock to the connectors, and the module wiring carries the pulses from the connectors to the SDRAM memory chips on the modules positioned in the connectors.

The terms "wire" and "wiring" as used herein refer to the electrically conductive pathways which interconnect the components of the memory subsystem of this invention. Generally, the wiring will comprise conventional copper traces formed on a circuit board, however, other forms of wiring are contemplated and could be used in some applications.

When the memory subsystem is constructed according to the invention, the clock wiring is designed with an impedance and length such that the round trip delay time of clock pulses over the length of the wiring (clock wiring plus module wiring) is less than the known rise time of the clock pulses.

The preferred design places the clock between two banks of connectors located in close proximity to one another with eight connectors grouped into two banks of four connectors positioned on opposite sides of the clock. In this embodiment, the subsystem further includes two groups of multiplexers positioned on opposite sides of the clock between the two banks of connectors. This positioning has numerous advantages in keeping the length of the wiring short.

In the most highly preferred embodiment of the invention, the connectors may accept either SDRAM or conventional DRAM memory. Conventional DRAM memory includes all types of non-synchronous or asynchronous memory (commonly referred to simply as DRAM) including extended data out (EDO) DRAM. In this preferred design, the memory controller is also capable of controlling both SDRAM and DRAM. This permits great flexibility in the type of memory used in the system.

In another embodiment of the invention, the clock is mounted to the circuit board adjacent to two banks of connectors, with the connectors in one bank being interleaved with the connectors of the other bank. In this embodiment, very tight control over the spacing between the connectors holding the memory modules is exercised to ensure that the critical relationship between the length of the wiring and the rise time of the clock pulses is maintained.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1–2 of the drawings in which like numerals refer to like features of the invention.

The present invention is directed to solving the problems involved in designing a high speed and low cost SDRAM memory subsystem, particularly the problems associated with transmission line effects encountered when the wiring between the clock and the SDRAM memory modules is long.

Previous solutions to this problem have involved the use of thin film buried series resistors and/or near or far end terminations designed to reduce signal reflection. The present invention achieves a solution to the problem through careful placement of the memory relative to support electronics, such as the clock and multiplexers, so as to minimize wire length needed to connect the memory to its support electronics.

Figure 1:
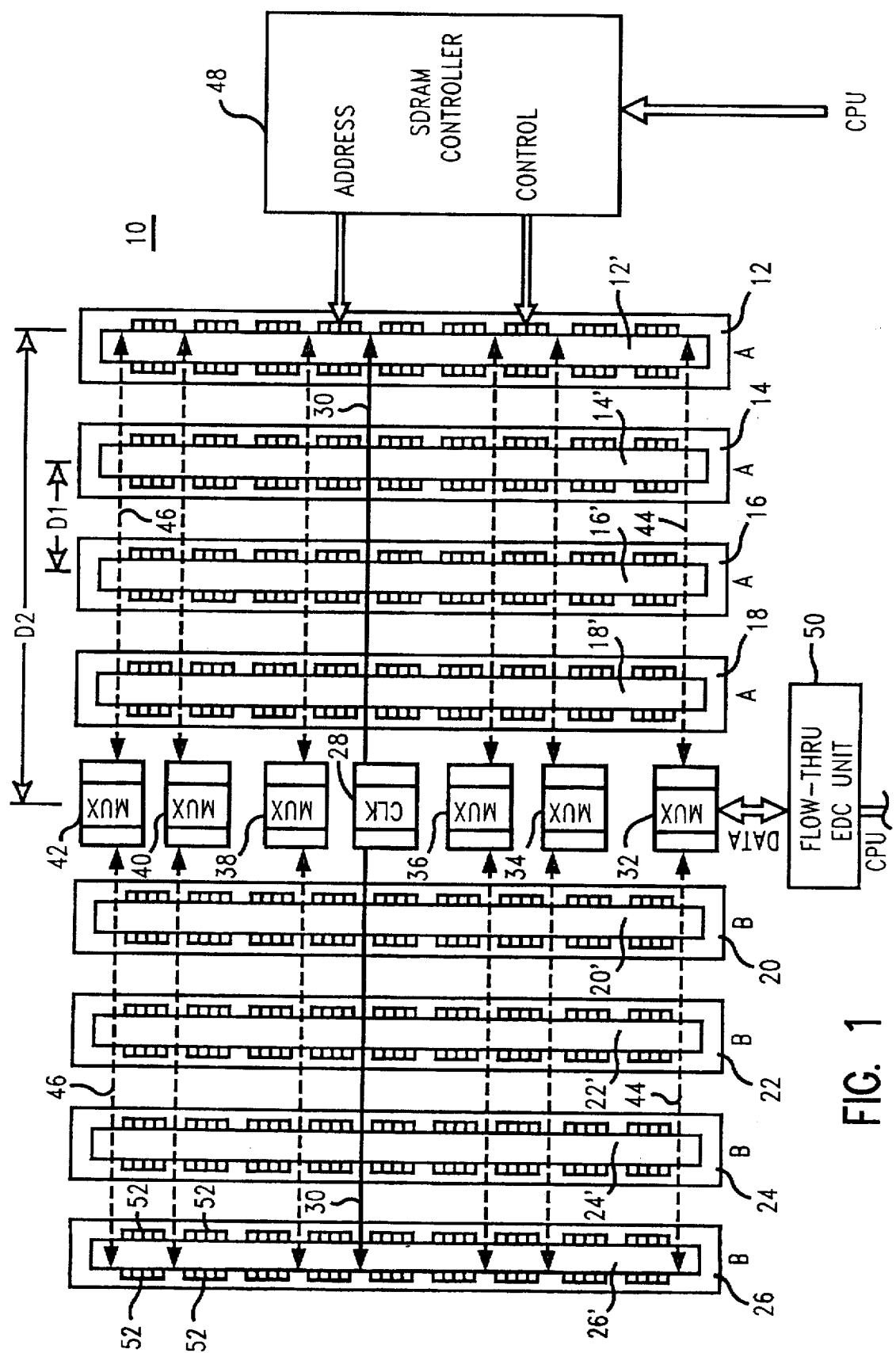
FIG. 1 provides a plan view of a memory module and circuit layout of the preferred embodiment of the invention.

FIG. 1 provides the preferred embodiment of the invention. This view provides a plan view of a circuit board substrate 10 such as the motherboard of a personal computer.

Connected to the circuit board 10 are eight memory module connectors 12–26 organized into two banks of connectors. The group of connectors including connectors 12–18 comprises bank A and the group of connectors including connectors 20–26 comprises bank B. The connectors of each group are spaced apart by a pitch spacing D1, with the farthest connectors 12 and 26 being located a maximum distance D2 from the centerline between the two banks of connectors. The connectors 12–26 are designed to accept memory modules 12' through 26' containing synchronous dynamic random access memory (SDRAM) chips 52.

In the preferred design, these memory modules are dual in-line memory modules (DIMM). However, single in-line memory modules (SIMM) may also be employed with this invention. In the most highly preferred design, the connectors 12–26 are also capable of receiving non-synchronous types of dynamic random access memory (DRAM).

At the center of the memory subsystem and located between the two banks of connectors is the clock 28. Typically the clock will be based upon a phase-lock loop (PLL). The SDRAM memory is connected to the clock 28 via clock wiring 30. The clock wiring in FIG. 1 is drawn in idealized form to simplify the drawing. Those skilled in the art will recognize that the clock wiring connects to each connector 12–26, and extends from the connector to the individual SDRAM memory chips on module wiring located on the surface of each module. Timing considerations require that the wiring from the clock 28 to the nearest SDRAM be the same length as the wiring to the most distant SDRAM memory. Thus, the wiring from clock 28 to the memory on DIMM modules 26' and 12' will be approximately straight, whereas the clock wiring to closer modules will take a more circuitous route in order to have the same length.

By placing the clock 28 in the center of the memory subsystem as is shown in FIG. 1, the distance from the clock to the most distant memory on DIMM modules 12' and 26' is minimized. The total length of the wiring carrying the clock signal will be the length of the clock wiring on the circuit board 10 (which carries the clock signal from the clock to the connector) plus the length of the module wiring (which carries the clock signal on the module from the connector to the individual SDRAM memory chips).

SDRAM memory is significantly faster than DRAM memory and thus the clock 28 may be expected to produce clock pluses at a frequency above 66 MHz, preferably up to or beyond 100 MHz. At these frequencies, the distance from the clock to the most distant memory chips is of critical importance in an SDRAM memory subsystem. If the most distant memory chips are too far away from the clock, transmission line effects begin to reduce the quality of the signal.

The present invention positions the clock relative to the connectors, and spaces the connectors close together, so that the wiring length meets the following criterion: the rise time of the clock pulses, which is known, must be greater than the round trip delay time for the clock pulses. The round trip delay time is determined by the impedance and length of the clock wiring plus the length of the module wiring) which is within the control of the memory subsystem designer.

Using the preferred layout of clock and connectors shown in FIG. 1, with a clock pulse having a 1 nanosecond rise time and with a typical impedance for the clock wiring and the module wiring of 50 ohms, the maximum length for the combined clock wiring and module wiring is 3.4 inches (8.6 centimeters).

In the preferred design, the distance for the spacing D1 between the connectors is 0.3 inches (0.76 cm). To provide sufficient space for the support electronics in the center region, D2 is most preferably about 1.5 inches (3.8 cm). This provides an appropriate balance between the length of the clock wiring 30 on the circuit board 10 and the length of the module wiring on the DIMM modules. The pitch spacing D1 may be increased up to about 0.5 inches (1.27 cm) provided that the length of the module wiring on the DIMM modules is decreased accordingly to control the total wire length.

With a given type of SDRAM memory module having a known impedance and length of module wiring, and with a given clock having a known clock pulse rise time, the length of the clock wiring needs to be kept sufficiently short that the round trip delay time of clock pulses from the clock to the SDRAM chips is less than the rise time of the clock pulses. The minimum acceptable rise time for clock pulses in the design given in FIG. 1 is approximately 800 picoseconds.

The preferred embodiment of FIG. 1 has a layout of wiring and electronic support chips which allows this criterion to be met. This embodiment places the clock and multiplexers 32–42 between two separate banks A, B of DIMMs. This positioning has two major advantages. The first is a relatively short wiring length, not only for the clock wiring, but also for the data and address wiring. The second is that this layout separates the data net wiring between the two banks. The data net wiring from the clock and multiplexers goes left to bank B and right to bank A. This separation minimizes coupled noise. By separating the data net wiring between the left and right banks, not only is the coupled noise reduced, but the difficulty of wiring the large number of connections is reduced.

The criteria described above for the clock signal, where the signal rise time must be greater than the round trip delay time, also applies to signals carried between the multiplexers 32–42 and the SDRPM memory modules. Accordingly, for the same reasons described, it is necessary to keep the wiring between the multiplexers and the memory modules correspondingly short. However, the exact center of the two banks is already occupied by the clock chip 28. This requires that any multiplexer be positioned to one side or the other of the clock.

Although large capacity multiplexers are available, if such a multiplexer were used, the wiring from that multiplexer would have to travel some additional distance to cross from the side of the clock where the single multiplexer is located to the opposite side of the clock where the memory is located. In the orientation of FIG. 1, if a single multiplexer were used below the clock, e.g. in the position of multiplexer 32, 34 or 36, the wiring from that multiplexer would have to travel to the upper half of FIG. 1, i.e., above the clock, in order to access memory chips located in that area.

To avoid this additional wiring length, multiple multiplexers are used which access memory chips on their corresponding side of the clock. For example, multiplexer 32 accesses SDRAM memory chips to its left or right in the region below the clock, whereas, multiplexer 42 accesses the memory to its left or right in the region above the clock. By breaking the multiplexing down into multiple individual multiplexers, the wiring length from the multiplexer 32 over wires 44 can be kept as short as possible. Multiplexer 42 accesses its memory over wires 46.

The connectors 12–26 are all kept in close proximity to one another and are as close as is feasible given the physical sizes of the various components.

The memory is controlled through SDRAM controller 48 which is also positioned in close proximity to the connectors 12–26. Error correction is provided by flow through error detection and correction unit (EDC Unit) 50. The central processing unit (CPU) (not shown) controls the SDRAM controller 48 and the EDC Unit 50. Where desired, the subsystem designer may eliminate the EDC Unit 50 and directly connect the bus to the multiplexers.

In the most highly preferred design, the SDRAM controller 48 is designed to control both SDRAM and non-synchronous types of DRAM. This allows the memory subsystem to be interchangeably used for both SDRAM and slower DRAM memory. By arranging the clock and multiplexers in the configuration shown, the necessity for series resistors and near and far end transmission line termination is avoided, which substantially reduces the cost of the memory subsystem.

Figure 2:
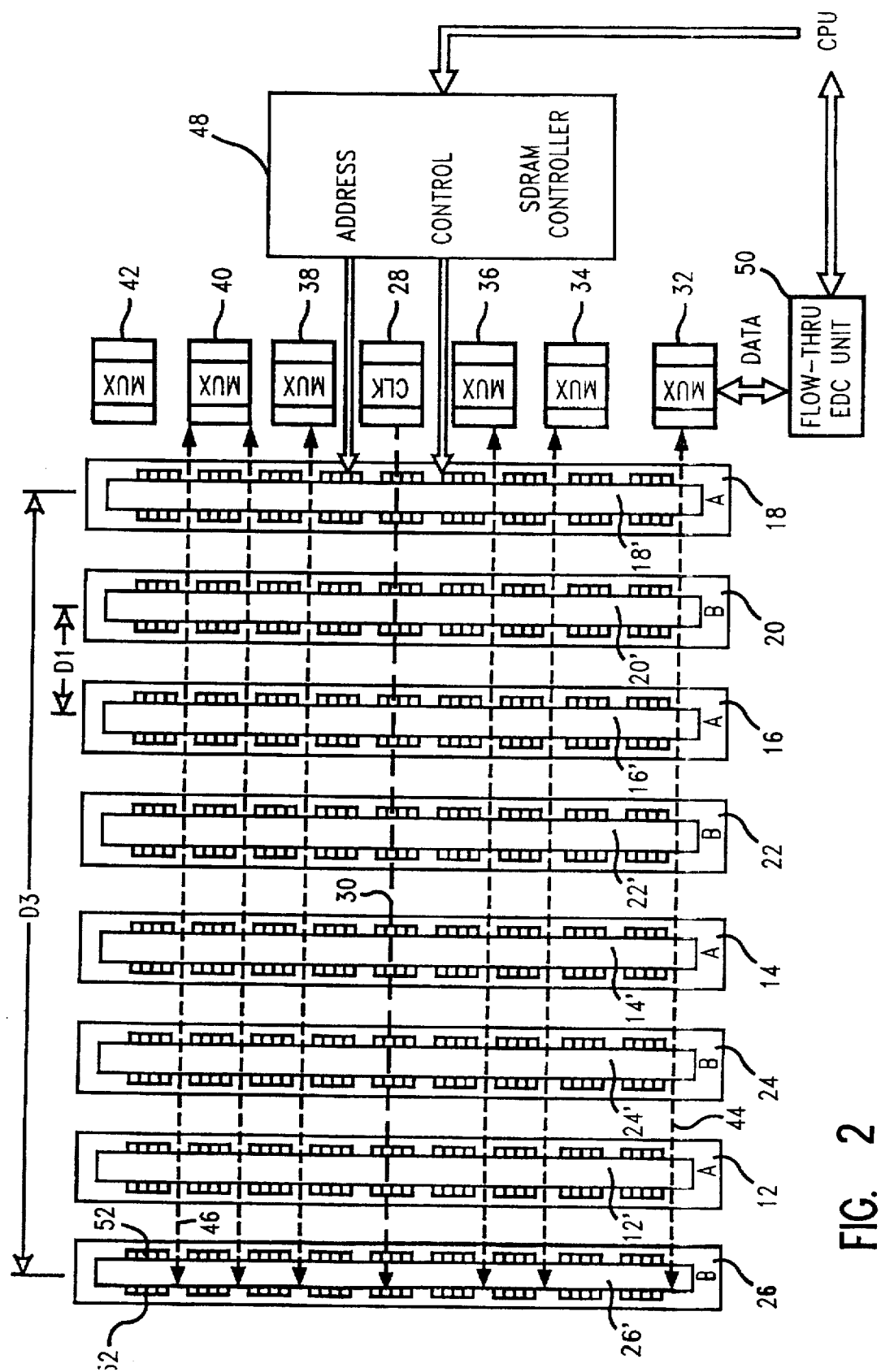
FIG. 2 provides a plan view of memory module and circuit element layout of an alternative embodiment of the present invention.

FIG. 2 shows an alternative embodiment of the present invention in which the two banks of connectors A and B are interleaved and the clock and multiplexers are positioned at one side of the interleaved banks.

In the design of FIG. 2, the pitch spacing D1 must be even more tightly controlled than in the design shown in FIG. 1 to minimize the distance D3. The distance between the clock 28 and the most distant memory module 26 must be minimized in order to avoid exceeding the criteria that the round trip delay be less than the signal rise time. As in the case of FIG. 1, the round trip delay is set by the length of the clock wiring 30 (to the most distant DIMM 26), by the impedance of the clock wiring and by the length and impedance of the module wiring carrying the clock signal on the DIMM 26'.

An example layout corresponding to the embodiment of FIG. 2 provides 0.3 inch pitch spacing D1, a maximum length for the clock wiring on the circuit board 10 of 2.3 inches, a maximum length for the module wiring on the DIMMs of 1.1 inches, an impedance of 50 ohms for the wiring and a minimum clock pulse rise time of 1 nanosecond. Variations in these lengths may be made provided that the wiring length is always sufficiently short such that the round trip delay time remains less than the signal rise time for signals carried on the wiring.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A synchronous dynamic random access memory subsystem comprising:

a circuit board;

a plurality of connectors mounted to the circuit board in close proximity to one another, the connectors being designed to receive corresponding synchronous dynamic random access memory modules having module wiring for carrying clock pulses from the corresponding connector to memory mounted on the synchronous dynamic random access memory module;

a clock for producing clock pulses having a known rise time, the clock being mounted to the circuit board in close proximity to the connectors; and clock wiring located on the circuit board between the clock and the connectors for providing the clock pulses to synchronous dynamic random access memory modules positioned in the connectors, the clock wiring having an impedance and length such that the round trip delay time of clock pulses over the clock wiring and the module wiring between the clock and memory on the synchronous dynamic random access memory modules has a round trip delay time that is less than the known rise time of the clock pulses.

2. The synchronous dynamic random access memory subsystem according to claim 1 wherein the clock is mounted to the circuit board between banks of connectors located in close proximity to one another.

3. The synchronous dynamic random access memory subsystem according to claim 2 wherein there are eight connectors grouped into two banks of four connectors positioned on opposite sides of the clock.

4. The synchronous dynamic random access memory subsystem according to claim 2 wherein there are two banks of connectors and the clock is centrally positioned between the two banks, and wherein the subsystem further includes two groups of multiplexers positioned on opposite sides of the clock between the two banks of connectors.

5. The synchronous dynamic random access memory subsystem according to claim 1 wherein the plurality of connectors are sequentially spaced apart by 0.5 inches or less.

6. The synchronous dynamic random access memory subsystem according to claim 5 wherein the plurality of connectors are sequentially spaced apart by approximately 0.3 inches.

7. The synchronous dynamic random access memory subsystem according to claim 1 further including a plurality of multiplexers mounted to the circuit board in close proximity to the connectors.

8. The synchronous dynamic random access memory subsystem according to claim 7 wherein the connectors are organized into two banks and the multiplexers are mounted to the circuit board between the two banks of connectors.

9. The synchronous dynamic random access memory subsystem according to claim 1 wherein the connectors are designed to receive corresponding dual inline memory modules containing synchronous dynamic random access memory.

10. The synchronous dynamic random access memory subsystem according to claim 1 wherein the clock produces clock pulses having a rise time of one nanosecond or less.

11. The synchronous dynamic random access memory subsystem according to claim 10 wherein the length of the clock wiring plus the module wiring is no greater than approximately 3.4 inches.

12. The synchronous dynamic random access memory subsystem according to claim 1 further including a memory controller mounted to the circuit board in close proximity to the connectors.

13. The synchronous dynamic random access memory subsystem according to claim 12 wherein the memory controller is capable of controlling synchronous dynamic random access memory and is also capable of controlling non-synchronous dynamic random access memory.

14. The synchronous dynamic random access memory subsystem according to claim 1 wherein the clock is mounted to the circuit board adjacent to two banks of connectors, the connectors in one bank being interleaved with the connectors of the other bank.

15. The synchronous dynamic random access memory subsystem according to claim 14 further including a plurality of multiplexers mounted to the circuit board in close proximity to the connectors.

16. The synchronous dynamic random access memory subsystem according to claim 1 wherein the clock produces clock pulses at a frequency above 66 MHz.

17. The synchronous dynamic random access memory subsystem according to claim 16 wherein the clock produces clock pulses at a frequency of about 100 MHz.

18. The synchronous dynamic random access memory subsystem according to claim 1 wherein the length of the clock wiring has been adjusted to avoid transmission line effects.

19. A synchronous dynamic random access memory subsystem comprising:

a circuit board;

a plurality of connectors mounted to the circuit board in two banks in close proximity to one another, the connectors being designed to receive corresponding dual inline memory modules containing synchronous dynamic random access memory, the dual inline memory modules having wiring for carrying clock pulses, data and address signals from the corresponding connector to the synchronous dynamic random access memory;

a clock for producing the clock pulses at a frequency above 66 MHz, the clock pulses having a known rise time, the clock being mounted to the circuit board in close proximity to the connectors;

a plurality of multiplexers mounted to the circuit board in close proximity to the connectors; and wiring located on the circuit board for carrying the clock pulses between the clock, the multiplexers, and the connectors, the wiring on the circuit board having an impedance and length such that the round trip delay time of the clock pulses carried is less than the known rise time of the clock pulses.

* * * * *